(12) United States Patent
Sim et al.

(10) Patent No.: US 11,470,734 B2
(45) Date of Patent: Oct. 11, 2022

(54) METAL PLATE AND DISPLAY DEVICE INCLUDING THE SAME

(71) Applicant: Samsung Display Co., LTD., Yongin-si (KR)

(72) Inventors: Jin Yong Sim, Seongnam-si (KR); Yun Jae Kim, Cheonan-si (KR); Jin Hyoung Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/127,246

(22) Filed: Dec. 18, 2020

(65) Prior Publication Data

US 2021/0337686 A1    Oct. 28, 2021

(30) Foreign Application Priority Data

Apr. 22, 2020    (KR) .................. 10-2020-0048634

(51) Int. Cl.
| | |
|---|---|
| *H05K 7/02* | (2006.01) |
| *H05K 7/04* | (2006.01) |
| *H05K 5/02* | (2006.01) |
| *H05K 5/00* | (2006.01) |

(52) U.S. Cl.
CPC ......... *H05K 5/0217* (2013.01); *H05K 5/0017* (2013.01)

(58) Field of Classification Search
USPC ........................... 361/807, 809, 810
See application file for complete search history.

(56) References Cited

U.S. PATENT DOCUMENTS

| | | | |
|---|---|---|---|
| 9,204,565 B1 * | 12/2015 | Lee | ............... E05F 1/1016 |
| 9,983,424 B2 | 5/2018 | Kim et al. | |
| 10,056,443 B2 | 8/2018 | Shyu et al. | |
| 10,074,824 B2 | 9/2018 | Han et al. | |
| 10,164,208 B2 | 12/2018 | Lee et al. | |
| 10,345,856 B2 | 7/2019 | Song | |
| 10,368,452 B2 | 7/2019 | Yun et al. | |
| 2018/0150108 A1 * | 5/2018 | Song | ............... H05K 1/028 |

* cited by examiner

*Primary Examiner* — Hung S. Bui
(74) *Attorney, Agent, or Firm* — Kile Park Reed & Houtteman PLLC

(57) ABSTRACT

A display device includes a display panel including a front surface that displays an image, and a rear surface, wherein the display panel is foldable with respect to a folding axis extending in a first direction; and a metal plate disposed on the rear surface of the display panel, wherein the metal plate includes a first body and a second body that are arranged in a second direction intersecting the first direction; a patterned portion disposed between the first body and the second body to overlap the folding axis in a thickness direction of the display device; and at least one protrusion protruding parallel to the folding axis from an edge of at least one of the first body, the second body, and the patterned portion.

20 Claims, 15 Drawing Sheets

METAL PLATE AND DISPLAY DEVICE INCLUDING THE SAME

CROSS-REFERENCE TO RELATED APPLICATION

This application claims priority from Korean Patent Application No. 10-2020-0048634 filed on Apr. 22, 2020 in the Korean Intellectual Property Office (KIPO) and all the benefits accruing therefrom under 35 U.S.C. 119, the contents of which in its entirety are herein incorporated by reference.

BACKGROUND

1. Technical Field

The disclosure relates to a metal plate and a display device including the same.

2. Description of the Related Art

A display device is a device for displaying images and includes a display panel such as a liquid crystal display panel or an organic light emitting display panel having organic light emitting diodes (OLED) or quantum dot light emitting diodes (QLED).

A mobile electronic device includes a display unit to provide images to a user. Generally speaking, the market share of mobile electronic devices having a volume or thickness equal to or smaller than and a display screen larger than those of the conventional mobile electronic devices has increased. A foldable display device or a bendable display device, which has a structure that can be folded and unfolded to provide a larger screen, has also been developed.

The foldable display device may include a metal plate disposed on a rear surface of the display panel and configured such that at least a portion thereof is extensible and contractible in case that the display panel is folded.

SUMMARY

Aspects of the disclosure provide a metal plate having accurate dimensions and a display device including the same.

However, aspects of the disclosure are not restricted to the ones set forth herein. The above and other aspects of the disclosure will become more apparent to one of ordinary skill in the art to which the disclosure pertains by referencing the detailed description of the disclosure given below.

An embodiment of a display device may include a display panel including a front surface that displays an image; and a rear surface, wherein the display panel may be foldable with respect to a folding axis extending in a first direction; and a metal plate disposed on the rear surface of the display panel, wherein the metal plate may include a first body and a second body that are arranged in a second direction intersecting the first direction; a patterned portion disposed between the first body and the second body to overlap the folding axis in a thickness direction of the display device; and at least one protrusion protruding parallel to the folding axis from an edge of at least one of the first body, the second body, and the patterned portion.

At least one protrusion may comprise a plurality of protrusions disposed in the first body and the second body.

Each of the first body and the second body may include first and second side surfaces extending in the second direction. The plurality of protrusions may include a pair of first protrusions disposed on the first side surface and the second side surface of the first body; and a pair of second protrusions disposed on the first side surface and the second side surface of the second body.

Each of the first body and the second body may include a first concave portion on the first side surface and a second concave portion on the second side surface, the first and second concave portions being recessed in a direction parallel to the folding axis. The pair of first protrusions may be disposed in the first concave portion and the second concave portion of the first body. The pair of second protrusions may be disposed in the first concave portion and the second concave portion of the second body.

Each of a recess depth of the first concave portion and a recess depth of the second concave portion may be greater than each of a protruding length of the first protrusion and a protruding length of the second protrusion.

The at least one protrusion may include a burr at an end portion of the at least one protrusion.

A thickness of the at least one protrusion may decrease toward the end portion of the at least one protrusion.

The at least one protrusion may include an inclined surface with respect to the front surface or the rear surface. The burr may be disposed at an end of the inclined surface.

The plurality of protrusions may be symmetrically arranged with respect to the folding axis.

The plurality of protrusions may be disposed in the patterned portion. The patterned portion may include a pattern forming a plurality of openings. The plurality of protrusions and the pattern may be integral with each other.

An embodiment of a metal plate may include a first body and a second body that are arranged in a first direction; a patterned portion disposed between the first body and the second body; and a pair of bridges that limit extension and contraction of the patterned portion within a range, each of the pair of bridges including a first end connected to the first body; and a second end connected to the second body.

The pair of bridges may be spaced apart from the patterned portion and may surround both side surfaces, respectively, of the patterned portion.

Each of the pair of bridges may include an extension portion extending in the first direction; a first fixing portion connecting a first end of the extension portion to the first body; and a second fixing portion connecting a second end of the extension portion to the second body.

Each of the first fixing portion and the second fixing portion may include a plurality of connection legs; and at least one opening between the plurality of connection legs.

Each of the first fixing portion and the second fixing portion may include a cut groove.

The metal plate may further include at least one alignment portion disposed between the first fixing portion and the second fixing portion.

Each of the first body and the second body may include a first concave portion and a second concave portion that are recessed in a second direction intersecting the first direction. The first fixing portion and the second fixing portion may be respectively disposed in the first concave portion and the second concave portion.

An embodiment of a metal plate may include a first body and a second body that are arranged in a first direction; a patterned portion disposed between the first body and the second body; and a pair of bridges that limit extension and contraction of the patterned portion within a range, each of the pair of bridges including a first end connected to a first side of the patterned portion; and a second end connected to a second side of the patterned portion.

The patterned portion may include a pattern forming a plurality of openings. The pair of bridges and the pattern may be integral with each other.

Each of the pair of bridges may include an extension portion extending in the first direction; a first fixing portion connecting a first side of the extension portion to a first corner region of the patterned portion; and a second fixing portion connecting a second side of the extension portion to a second corner region of the patterned portion.

The metal plate and the display device including the same according to an exemplary embodiment may have accurate or exaggerated dimensions.

The effects of the disclosure are not limited to the aforementioned effects, and various other effects are included in the disclosure.

BRIEF DESCRIPTION OF THE DRAWINGS

The above and other aspects and features of the disclosure will become more apparent by describing in detail some embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. The invention may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present. The same reference numbers indicate the same components throughout the specification. In the attached figures, the thickness of layers and regions may be exaggerated for clarity.

In the specification and the claims, the phrase "at least one of" is intended to include the meaning of "at least one selected from the group of" for the purpose of its meaning and interpretation. For example, "at least one of A and B" may be understood to mean "A, B, or A and B."

When a component is described herein to "connect" another component to the other component or to be "connected to" other components, the components may be connected to each other as separate elements, or the components may be integral with each other.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Hereinafter, embodiments will be described in detail with reference to the accompanying drawings.

Figure 1:
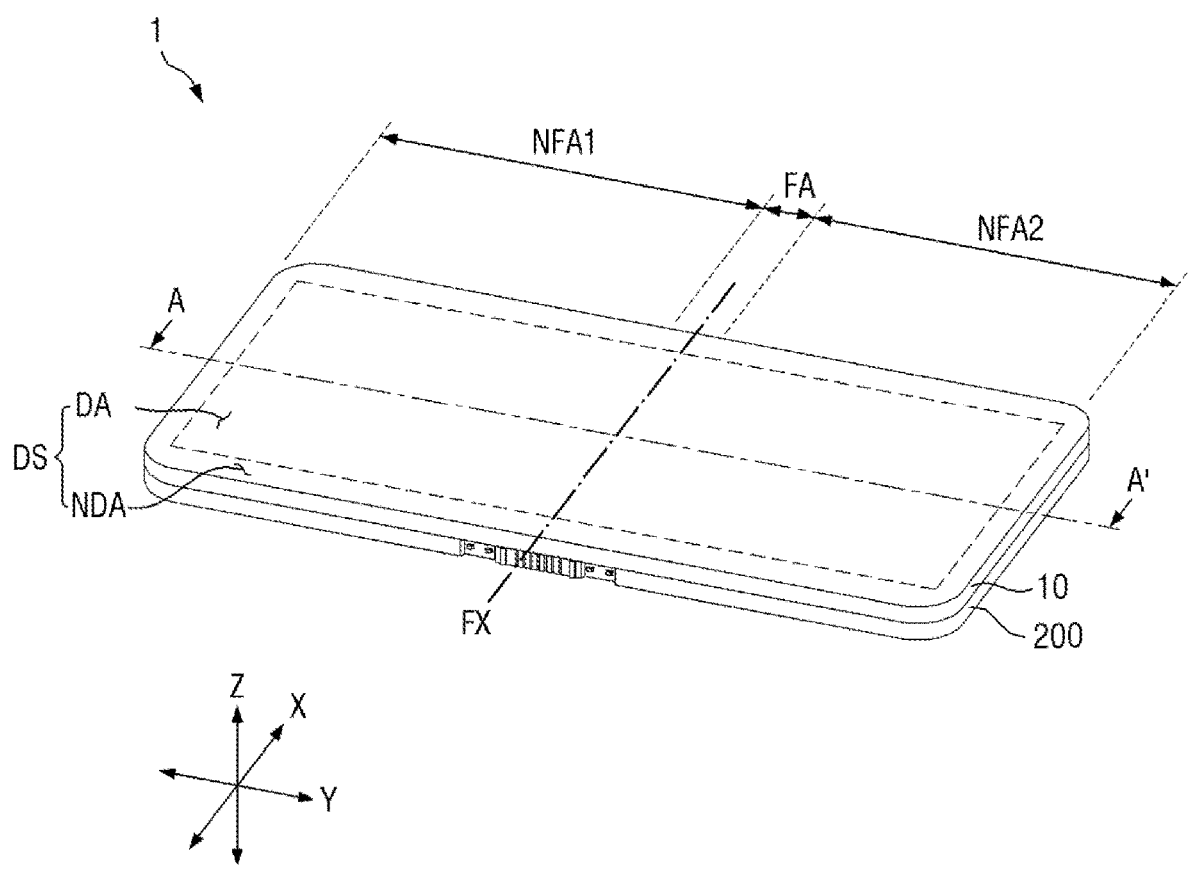
FIG. 1 is a schematic perspective view of a display device according to an embodiment.
Figure 2:
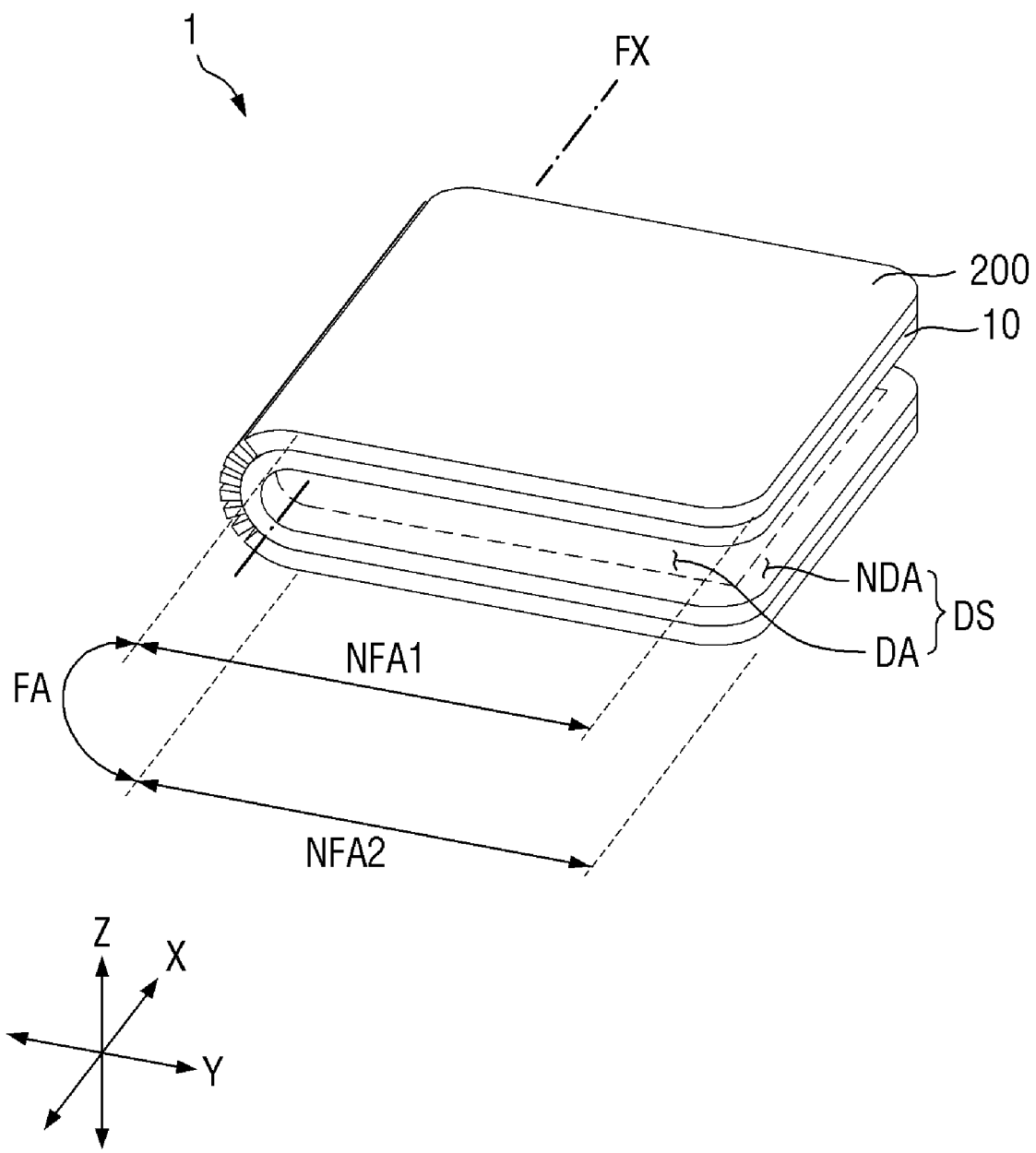
FIG. 2 is a schematic perspective view of the display device of FIG. 1 in a folded state.

FIG. 1 is a schematic perspective view of a display device according to an embodiment. FIG. 2 is a schematic perspective view of the display device of FIG. 1 in a folded configuration.

Hereinafter, a first direction X, a second direction Y, and a third direction Z intersect each other in different directions. The first direction X, the second direction Y, and the third direction Z may be a length direction, a width direction, and a thickness direction, respectively. The third direction Z may include a front direction toward the upper side of the drawing and a rear direction toward the lower side of the drawing. Accordingly, one surface of a member, which is disposed toward the front direction, may be referred to as a front surface; and the other surface of the member, which is disposed toward the rear direction, may be referred to as a rear surface. It should be understood, however, that the directions indicate relative directions and are not limited to the above examples.

A display device 1 according to an embodiment of the disclosure may include various devices that display an image on a screen. Examples of the display device 1 may include, but are not limited to, a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including a display portion DPA, an Internet-of-Things device, and the like.

Referring to FIGS. 1 and 2, the display device 1 may have a rectangular shape in a plan view. In an embodiment, the display device 1 may include two sides extending in the first direction X and two sides extending in the second direction Y crossing the first direction X, in a plan view. However, the disclosure is not limited thereto, and the display device 1 may have various shapes.

The display device 1 may include a front surface and a rear surface. The display device 1 may further include at least one side surface between the front surface and the rear surface.

The display device 1 includes at least one display surface DS. In an exemplary embodiment, the display surface DS may be the front surface of the display device 1. The display surface DS may be disposed over a folding area FA and non-folding areas NFA1 and NFA2, which will be described below. In some embodiments, both the front and rear surfaces of the display device 1 may be the display surfaces DS. In some embodiments, the display surfaces DS may be two or more surfaces among the front, rear, and side surfaces of the display device 1.

The display surface DS may include a display area DA and a non-display area NDA.

The display area DA displays an image or a video. Pixels may be disposed in the display area DA.

The non-display area NDA is disposed adjacent to (or around) the display area DA. The non-display area NDA may surround the display portion. The non-display area NDA may not display an image or a video. In an embodiment, the display area DA may have a rectangular shape, and the non-display area NDA may be disposed around four sides of the display portion, but the disclosure is not limited thereto. A black matrix may be disposed in the non-display area NDA to prevent light emitted from adjacent pixels from leaking out.

The display device 1 may be a foldable device. The display device 1 may be folded or unfolded. The meaning of the term "folded" may include "bent." The display device 1 may be folded such that a portion of the display device 1 overlaps the other portion or is inclined with respect to the other portion, or the display device 1 may be unfolded to be entirely flat. In an embodiment, the display device 1 may be folded such that a portion of the display device 1 is inclined with respect to the other portion at an angle greater than about 0 degree and less than about 180 degrees, or the display device 1 may be unfolded at an angle of about 180 degrees.

The display device 1 may be in-folded and/or out-folded. The in-folding may mean that the display device 1 is folded such that a part of the display surface DS of the display device 1 faces the other part of the display surface DS, and the out-folding may mean that the display device 1 is folded such that a part of the display surface DS of the display device 1 does not face the other part of the display surface DS. In the out-folding, the display device may be folded such that a part of a surface opposite to the display surface DS of the display device 1 faces the other part of the surface opposite to the display surface DS. In an embodiment, the display device 1 is in-folded, but the disclosure is not limited thereto.

The display device 1 may be in a folded configuration or an unfolded configuration. The folded configuration includes a configuration in which the display device 1 is bent. The folded configuration may be a configuration in which the display device is bent such that a part of the display device 1 is inclined with respect to the other part. The unfolded configuration may be a configuration in which a part and the other part of the display device 1 are disposed side by side on a plane. As another example, the folded configuration may be a configuration in which an angle between a part and the other part of the display device 1 is greater than about 0 degree and less than about 180 degrees and/or the angle is greater than about 180 degrees and less than about 360 degrees. The unfolded configuration may be a configuration in which an angle between a part and the other part of the display device 1 is about 180 degrees. Here, the part and the other part may be the non-folding areas NFA1 and NFA2, respectively, which will be described below.

The display device 1 may be divided into the folding area FA and the non-folding areas NFA1 and NFA2. The folding area FA is an area that is folded or bent as the display device 1 is folded. The non-folding areas NFA1 and NFA2 are areas that are not folded or bent. The non-folding areas NFA1 and NFA2 may include a first non-folding area NFA1 and a second non-folding area NFA2. In an embodiment, the first non-folding area NFA1 and the second non-folding area NFA2 may be arranged in the second direction Y, and the folding area FA may be disposed between the first non-folding area NFA1 and the second non-folding area NFA2. The embodiment defines one folding area FA and two non-folding areas NFA1 and NFA2 in the display device 1, but the disclosure is not limited thereto. In some embodiments, multiple folding areas FA and multiple non-folding areas NFA1 and NFA2 may be defined in the display device 1.

The display device 1 may be folded or unfolded with respect to a folding axis FX. The folding axis FX may be arranged to overlap the folding area FA in the thickness direction. In an exemplary embodiment, the display device 1 may be folded or unfolded with respect to the folding axis FX arranged in the first direction X, but the disclosure is not limited thereto. The folding axis FX may include at least one rotational axis. For example, the display device 1 may be folded or unfolded with respect to at least one center of curvature.

The display device 1 may include a display module 10 and a metal plate 200.

In some embodiments, the display device 1 may further include at least one of an elastic sheet disposed on the rear surface of the metal plate 200, at least one adhesive layer disposed between the elastic sheet and the metal plate 200, a hinge member for folding or unfolding the display device 1, or a rear surface cover.

Hereinafter, the display module 10 and the metal plate 200 will be described in detail with further reference to FIGS. 3 to 13.

Figure 3:
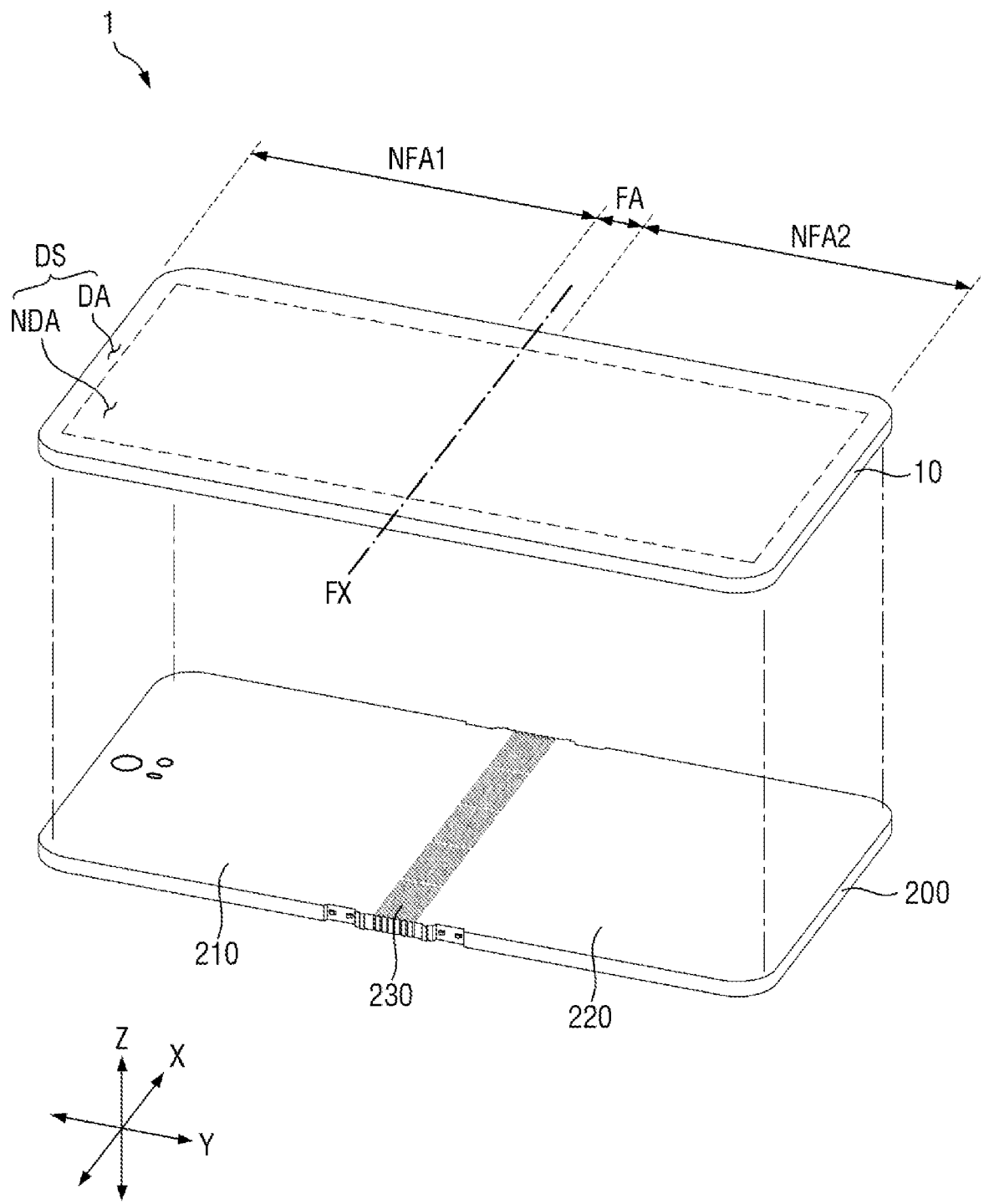
FIG. 3 is a schematic exploded perspective view of the display device of FIG. 1.
Figure 4:
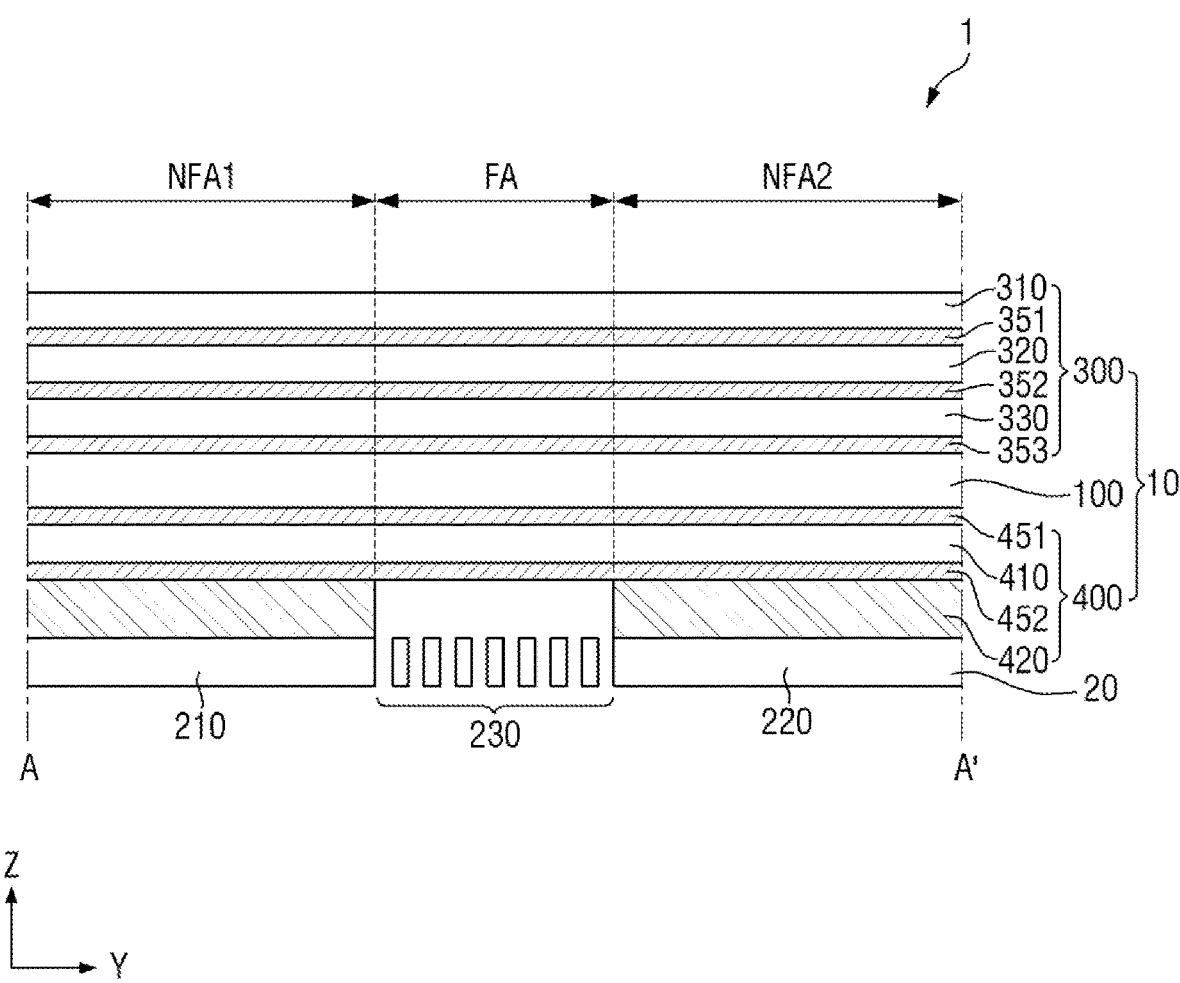
FIG. 4 is a schematic cross-sectional view of the display device, taken along line A-A' of FIG. 1.
Figure 5:
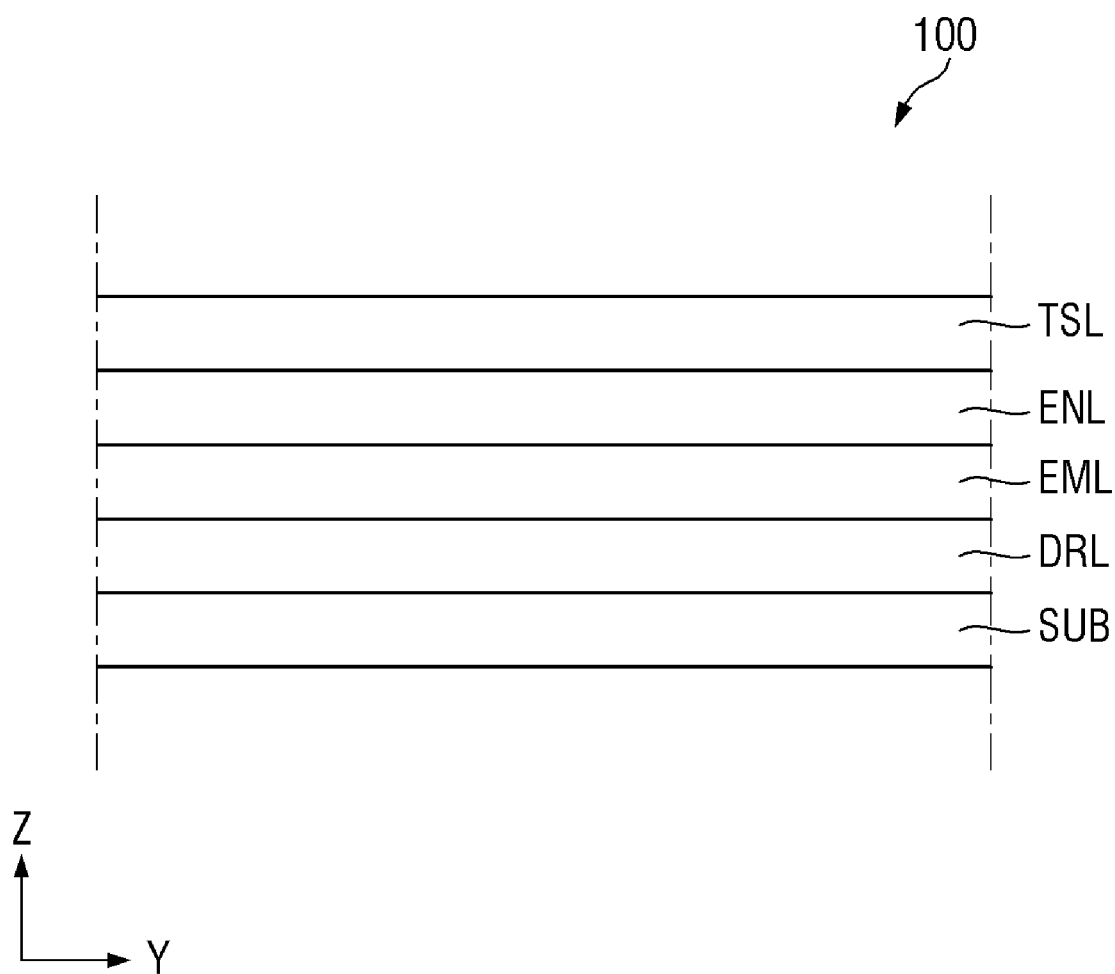
FIG. 5 is a schematic cross-sectional view of a display panel.

FIG. 3 is a schematic exploded perspective view of the display device of FIG. 1. FIG. 4 is a schematic cross-sectional view of the display device, taken along line A-A' of FIG. 1. FIG. 5 is a schematic cross-sectional view of a display panel.

Referring to FIGS. 1 to 5, the display module 10 may be disposed on the front surface of the metal plate 200. The front surface of the display module 10 may constitute the front surface of the display device 1.

The display module 10 has flexibility. The display module 10 may be disposed across the first non-folding area NFA1, the folding area FA, and the second non-folding area NFA2, and may be folded with respect to the folding axis FX.

Referring to FIG. 4, the display module 10 may include a display panel 100, a front stacked structure and a rear stacked structure.

The display module 10 may include the display panel 100, a front stacked structure 300 on the front side of the display panel 100 and a rear stacked structure 400 on the rear side of the display panel 100. The front side may be a side on which the display panel 100 displays a screen, and the rear side may be a side opposite to the front side.

The display panel 100 is a panel for displaying a screen or an image. Examples of the display panel 100 may include not only a self-luminous display panel such as an organic light emitting display (OLED) panel, an inorganic electroluminescence (EL) display panel, a quantum dot (QED) display panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel. Hereinafter, an organic light emitting display panel will be described as an example of the display panel 100, and the organic light emitting display panel applied to the embodiment will be simply referred to as the display panel 100 unless special distinction is required. However, the embodiment is not limited to the organic light emitting display panel, and other display panels mentioned above or known in the art may be applied within the scope of the same technical ideas.

The display panel 100 may further include a touch member. The touch member may be provided as a panel or film separate from the display panel 100 and attached onto the display panel 100 but may also be provided in the form of a touch layer inside the display panel 100. In the following embodiment, a case in which the touch member is provided inside the display panel 100 and included in the display panel 100 is illustrated, but the present disclosure is not limited thereto.

Referring to FIGS. 4 and 5, the display panel 100 may include a substrate SUB, a circuit driving layer DRL on the substrate SUB, a light emitting layer EML on the circuit driving layer DRL, and an encapsulation layer ENL on the light emitting layer EML, and a touch layer TSL on the encapsulation layer ENL.

The substrate SUB may be a flexible substrate including a flexible polymer material such as polyimide or the like. Accordingly, the display panel 100 can be bent, folded or rolled. In some embodiments, the substrate SUB may include sub-substrates overlapping in a thickness direction a barrier layer interposed therebetween. In this case, each sub-substrate may be a flexible substrate.

The circuit driving layer DRL may be disposed on the substrate SUB. The circuit driving layer DRL may include a circuit that drives the light emitting layer EML of the pixel. The circuit driving layer DRL may include thin film transistors.

The light emitting layer EML may be disposed on the circuit driving layer DRL. The light emitting layer EML may include an organic light emitting layer. The light emitting layer EML may emit light with various luminance levels according to a driving signal transmitted from the circuit driving layer DRL.

The encapsulation layer ENL may be disposed on the light emitting layer EML. The encapsulation layer ENL may include an inorganic layer or a laminated layer of an inorganic layer and an organic layer.

The touch layer TSL may be disposed on the encapsulation layer ENL. The touch layer TSL is a layer for recognizing a touch input and may function as a touch member. The touch layer TSL may include sensing areas and sensing electrodes.

Referring back to FIG. 4, the front stacked structure 300 is disposed on the front side of the display panel 100. The front stacked structure 300 may include a polarization member 330, a cover window 320, and a cover window protective layer 310, which are sequentially stacked forward from the display panel 100.

The polarization member 330 polarizes the light passing therethrough. The polarization member 330 may serve to reduce the reflection of external light. In one embodiment, the polarization member 330 may be a polarizing film. The polarizing film may include a polarizing layer and protective substrates sandwiching the polarizing layer therebetween. The polarization layer may include a polyvinyl alcohol film. The polarizing layer may be stretched in one direction. The stretching direction of the polarizing layer may be an absorption axis, and a direction perpendicular thereto may be a transmission axis. The protective substrates may be disposed on one surface and the other surface of the polarizing layer, respectively. The protective substrate may be made of cellulose resin such as triacetyl cellulose, polyester resin, or the like, but is not limited thereto.

The cover window 320 may be disposed on the front side of the polarization member 330. The cover window 320 serves to protect the display panel 100. The cover window 320 may be made of a transparent material. The cover window 320 may include, for example, glass or plastic.

In case that the cover window 320 includes glass, the glass may be ultra-thin glass (UTG) or thin glass. In case that the glass is ultra-thin glass or thin glass, it may have a flexible property such that it can be bent, folded, or rolled. The thickness of the glass may be, for example, in the range between about 10 µm and about 300 µm, particularly, about 30 µm and about 80 µm or about 50 µm. The glass of the cover window 320 may include soda-lime glass, alkali aluminosilicate glass, borosilicate glass, or lithium alumina silicate glass. The glass of the cover window 320 may include chemically strengthened or thermally strengthened glass to have strong rigidity. Chemical strengthening may be achieved through an ion exchange process in alkaline salts. The ion exchange process may be performed two or more times.

In case that the cover window 320 includes plastic, it may be more advantageous to exhibit flexible properties such as folding. Examples of plastics applicable to the cover window 320 may include, but are not limited to, polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyarylate (PAR), triacetyl cellulose (TAC), and cellulose acetate propionate (CAP). The plastic cover window 320 may be formed to include one or more of the plastic materials mentioned above.

A cover window protective layer 310 may be disposed on the front side of the cover window 320. The cover window protective layer 310 may perform at least one of functions of prevention of scattering, impact absorption, prevention of scratch, prevention of fingerprint smudges, and prevention of glare on the cover window 320. The cover window protective layer 310 may be formed to include a transparent polymer film. The transparent polymer film may include at least one of polyethylene terephthalate (PET), polyethylene naphthalate (PEN), polyether sulfone (PES), polyimide (PI), polyarylate (PAR), polycarbonate (PC), polymethyl methacrylate (PMMA), and cycloolefin copolymer (COC).

The front stacked structure 300 may include front bonding members 351, 352, and 353 for bonding adjacently stacked members. For example, a first bonding member 351 may be disposed between the cover window protective layer 310 and the cover window 320 to bond them, and a second bonding member 352 may be disposed between the cover window 320 and the polarization member 330 to bond them. A third bonding member 353 may be disposed between the polarization member 330 and the display panel 100 to bond them. For example, the front bonding members 351 to 353 may be members that attach the layers to one surface of the display panel 100. The first bonding member 351 may be a protective layer bonding member for attaching the cover window protective layer 310, the second bonding member 352 may be a window bonding member for attaching the cover window 320, and the third bonding member 353 may be a polarizing portion bonding member for attaching the polarization member 330. All of the front bonding members 351 to 353 may be optically transparent.

The rear stacked structure 400 is disposed on the rear side of the display panel 100. The rear stacked structure 400 may include a polymer film layer 410 and a heat dissipation member 420, which are sequentially stacked rearward from the display panel 100.

The polymer film layer 410 may include a polymer film. The polymer film layer 410 may include, for example, polyimide (PI), polyethylene terephthalate (PET), polycarbonate (PC), polyethylene (PE), polypropylene (PP), polysulfone (PSF), polymethylmethacrylate (PMMA), triacetylcellulose (TAC), cycloolefin polymer (COP) or the like. The polymer film layer 410 may include a functional layer on at least one surface thereof. The functional layer may include, for example, a light absorbing layer. The light absorbing layer may include a light absorbing material such as a black pigment or dye. The light absorbing layer may be formed by coating or printing black ink on a polymer film.

The heat dissipation member 420 may be disposed on the rear side of the polymer film layer 410. The heat dissipation member 420 serves to diffuse heat generated from the display panel 100 or other components of the display device 1. The heat dissipation member 420 may be a heat dissipation sheet including graphite, carbon nanotubes or the like. In an embodiment, the heat dissipation members 420 may be separated by the folding area FA to facilitate folding of the display device 1 as illustrated in FIGS. 3 and 4. In some embodiments, the heat dissipation members 420 may be connected as one body.

The rear stacked structure 400 may include rear bonding members 451 and 452 for bonding adjacently stacked members. For example, a fourth bonding member 451 may be disposed between the display panel 100 and the polymer film layer 410 to bond them, and a fifth bonding member 452 may be disposed between the polymer film layer 410 and the heat dissipation member 420 to bond them.

In some embodiments, the rear stacked structure 400 may further include a buffer member. The buffer member may be disposed, for example, between the polymer film layer 410 and the heat dissipation member 420.

Referring again to FIGS. 1 to 5, the metal plate 200 is disposed on the rear surface of the display module 10. The metal plate 200 may be attached to the rear surface of the rear stacked structure 400.

The metal plate 200 is disposed over the first non-folding area NFA1, the folding area FA, and the second non-folding area NFA2. The metal plate 200 has flexibility so that it can be folded with respect to the folding axis FX. The metal plate 200 may include a pattern forming openings and may be configured such that at least a portion thereof is extensible and contractible.

The metal plate 200 may have a rectangular shape elongated in the second direction Y, but the shape of the metal plate 200 is not limited thereto. In an embodiment, the metal plate 200 may include front and rear surfaces, which are parallel to a plane formed by the intersection of the first direction X and the second direction Y, and side surfaces extending in the third direction Z between the front and rear surfaces.

The metal plate 200 may have a size substantially equal to that of the display module 10. In some embodiments, the length of the metal plate 200 in the first direction X may be equal to that of the display module 10, whereas the length of the metal plate 200 in the second direction Y may be greater or less than that of the display module 10.

The metal plate 200 may have a thin thickness of about 0.1 mm to about 0.2 mm, for example.

The metal plate 200 may include stainless steel. The stainless steel may include at least one of iron, chromium, carbon, nickel, silicon, manganese or molybdenum, and an alloy thereof. In an embodiment, the metal plate 200 may be formed of austenitic stainless steel.

In some embodiments, the display device 1 may further include at least one layer disposed between the display module 10 and the metal plate 200 or on the rear surface of the metal plate 200, for adhesion, impact absorption, heat dissipation, or sensing inputs from external devices, for example.

The metal plate 200 may include a first body 210, a second body 220, and a connection portion 230.

The first body 210 and the second body 220 are arranged in the second direction Y. The first body 210 and the second body 220 may be symmetrically disposed with respect to the folding axis FX or the folding area FA. In an embodiment, the first body 210 and the second body 220 may be respectively disposed in the first non-folding area NFA1 and the second non-folding area NFA2. Accordingly, the first body 210 and the second body 220 may be kept flat regardless of folding of the display device 1. The first body 210 and the second body 220 may have a rectangular shape in a plan view, but the disclosure is not limited thereto. In an embodiment, the first body 210 and the second body 220 may be portions that maintain the length or the size thereof without being extended or contracted in case that the display device 1 is folded.

The connection portion 230 may be disposed between the first body 210 and the second body 220. The connection portion 230 may be arranged in the folding area FA. The connection portion 230 may be disposed to overlap the folding axis FX extending in the first direction X, in the thickness direction. The connection portion 230 has flexibility. The connection portion 230 may be extended or contracted by folding or unfolding of the metal plate 200. The connection portion 230 may have greater elasticity than the first body 210 and/or the second body 220. The connection portion 230 may reduce tensile or compressive stress caused by bending of the metal plate 200. The connection portion 230 may include a pattern forming openings. The connection portion 230 may be refer to as a patterned portion.

Hereinafter, the metal plate 200 will be described in further detail with reference to FIGS. 6 to 13.

Figure 6:
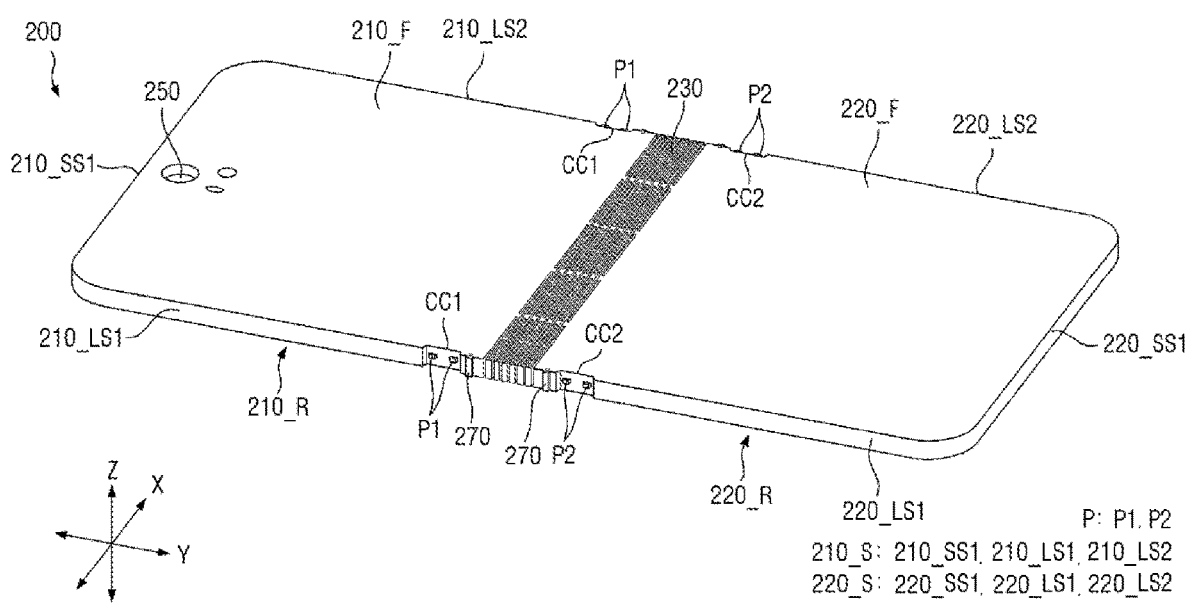
FIG. 6 is a schematic perspective view of a metal plate of the display device according to an exemplary embodiment.
Figure 7:
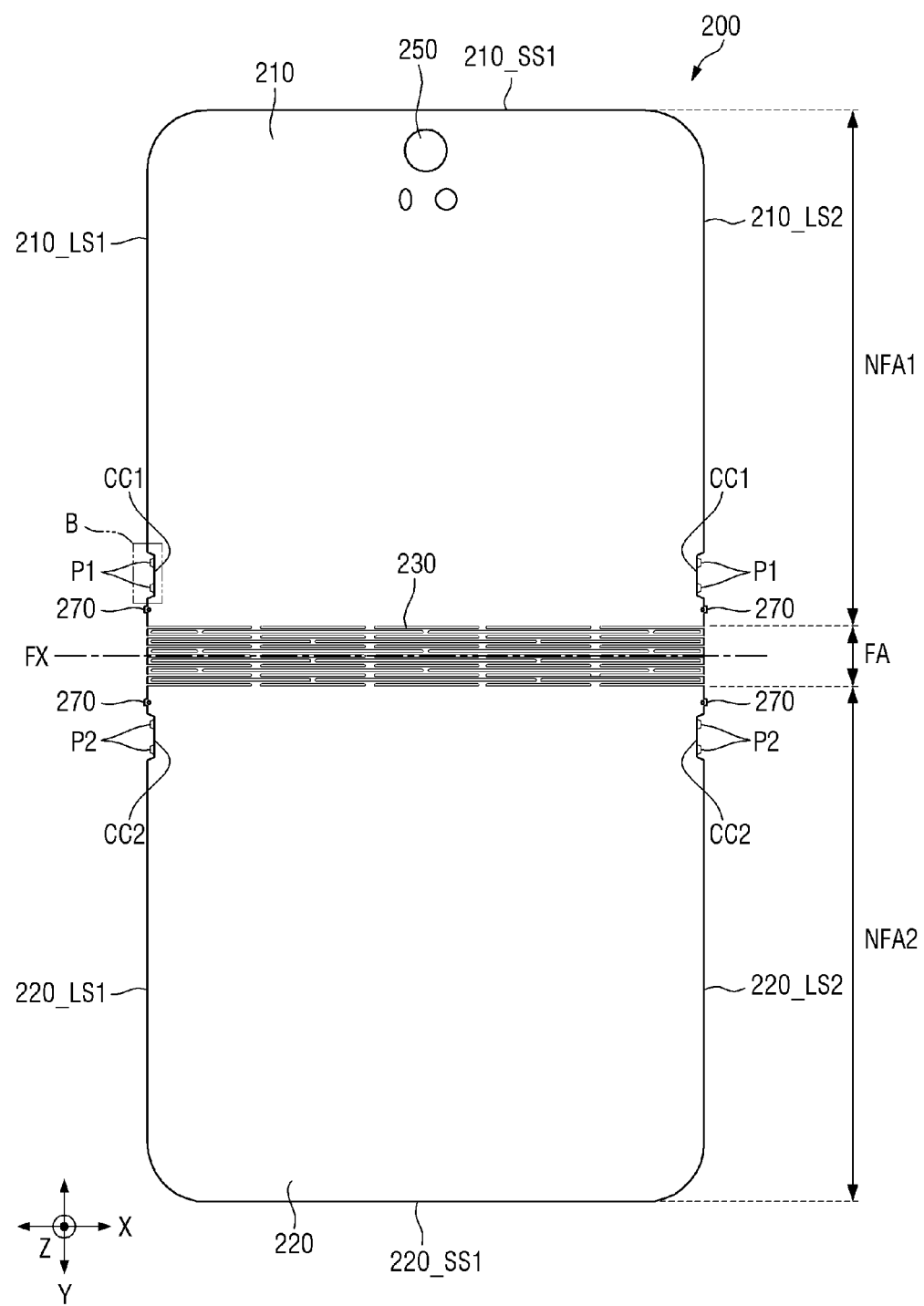
FIG. 7 is a schematic plan view of the metal plate of the display device according to an exemplary embodiment.
Figure 8:
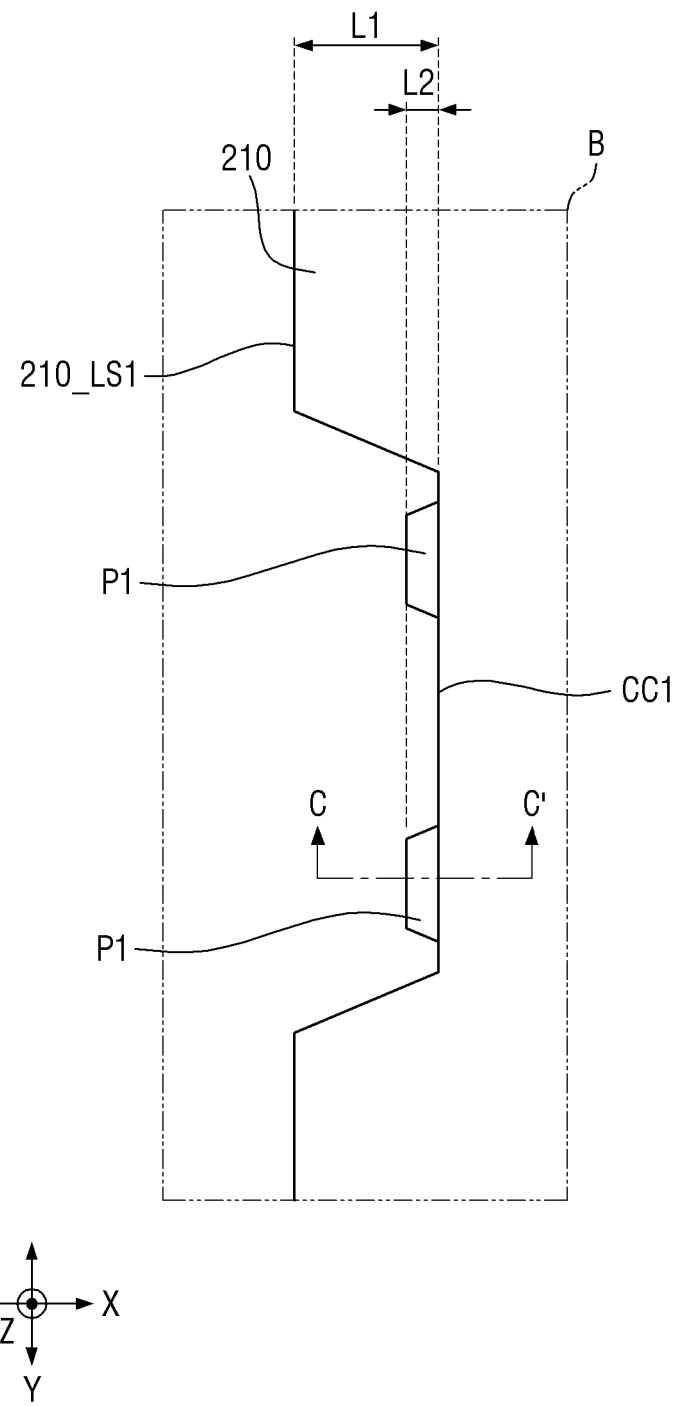
FIG. 8 is a schematic enlarged plan view of portion B of FIG. 7.
Figure 9:
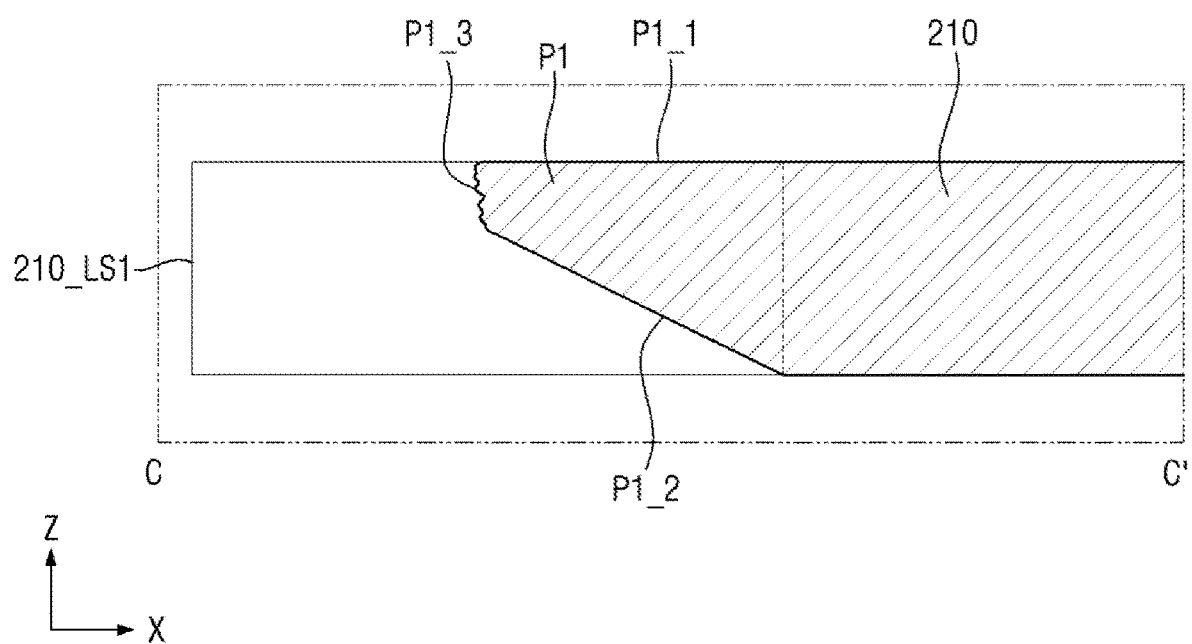
FIG. 9 is a schematic cross-sectional view of the metal plate taken along line C-C' of FIG. 8.

FIG. 6 is a schematic perspective view of the metal plate of the display device according to an embodiment. FIG. 7 is a schematic plan view of the metal plate of the display device according to an embodiment. FIG. 8 is a schematic enlarged plan view of portion B of FIG. 7. FIG. 9 is a schematic cross-sectional view of the metal plate taken along line C-C' of FIG. 8.

Referring to FIGS. 3 and 6, the first body 210 and the second body 220 may respectively include front surfaces 210_F and 220_F and rear surfaces 210_R and 220_R parallel to the first direction X and the second direction Y, and side surfaces 210_S and 220_S extending in the third direction Z between the front surfaces 210_F and 220_F and the rear surfaces 210_R and 220_R.

The side surfaces 210_S and 220_S of the first and second bodies 210 and 220 may respectively include first side surfaces 210_SS1 and 220_SS1 extending in the first direction X, and second side surfaces 210_LS1 and 220_LS1 and third side surfaces 210_LS2 and 220_LS2 extending in the second direction Y, in a plan view. From the perspective of FIG. 7, the first, second and third side surfaces 210_SS1, 210_LS1, and 210_LS2 of the first body 210 may be side surfaces positioned on the upper, left, and right sides, respectively. The first, second and third side surfaces 220_SS1, 220_LS1, and 220_LS2 of the second body 220 may be side surfaces positioned on the lower, left, and right sides, respectively. In an embodiment, the length of the first side surfaces 210_SS1 and 220_SS1 in the first direction X may be less than the length of the second side surfaces 210_LS1 and 220_LS1 or the length of the third side surfaces 210_LS2 and 220_LS2, in the second direction Y.

The metal plate 200 may further include protrusions P.

The protrusions P are disposed on the side surfaces of the first body 210 and the second body 220 and protrude parallel to the folding axis FX. The protrusions P may be disposed to overlap the first body 210, the second body 220, and the connection portion 230 in the first direction X or the second direction Y. In an embodiment, the protrusions P may be integrally formed with the first body 210 and the second body 220. In some embodiments, the protrusions P may be disposed on the side surfaces of the connection portion 230, which extend in the second direction Y. In this case, the protrusions P may be integrally formed with the pattern of the connection portion 230.

The protrusions P may have a trapezoidal shape in which the width of the protrusions P becomes narrower toward the end portion of the protrusions P in a plan view, but the disclosure is not limited thereto. In some embodiments, the protrusions P may have a rectangular shape with rounded corners.

The protrusions P may include first protrusions P1 and second protrusions P2.

The first protrusions P1 and the second protrusions P2 may be symmetrically disposed on the first body 210 and the second body 220 with respect to the folding area FA or the folding axis FX, respectively. The first protrusions P1 and the second protrusions P2 may be disposed closer to the folding area FA or the folding axis FX than the first side surfaces 210_SS1 of the first body 210 and the second body 220. For example, a distance between the first side surface 210_SS1 of the first body 210 and the first protrusion P1 may be equal to or greater than four times a distance between the folding area FA and the first protrusion P1.

The first protrusions P1 may be disposed on each of the second side surface 210_LS1 and the third side surface 210_LS2 of the first body 210. In an embodiment, a pair of the first protrusions P1 may be disposed on each of the second side surface 210_LS1 and the third side surface 210_LS2 of the first body 210. In some embodiments, one first protrusion P1 may be disposed on each of the second side surface 210_LS1 and the third side surface 210_LS2 of the first body 210. In some embodiments, three or more first protrusions P1 may be disposed on each of the second side surface 210_LS1 and the third side surface 210_LS2 of the first body 210.

The second protrusions P2 may be disposed on each of the second side surface 220_LS1 and the third side surface 220_LS2 of the second body 220. In an embodiment, a pair of the second protrusions P2 may be disposed on each of the second side surface 220_LS1 and the third side surface 220_LS2 of the second body 220. In some embodiments, one second protrusion P2 may be disposed on each of the second side surface 220_LS1 and the third side surface 220_LS2 of the second body 220. In some embodiments, three or more second protrusions P2 may be disposed on each of the second side surface 220_LS1 and the third side surface 220_LS2 of the second body 220.

The first protrusions P1 and the second protrusions P2 may be respectively disposed in first concave portions CC1 and second concave portions CC2, which will be described below.

The first body 210 and the second body 220 may include the first concave portions CC1 and the second concave portions CC2, respectively.

The first concave portions CC1 and the second concave portions CC2 may be symmetrically disposed at the first body 210 and the second body 220 with respect to the folding area FA or the folding axis FX, respectively. In an embodiment, a pair of the first concave portions CC1 may be respectively disposed in the second side surface 210_LS1 and the third side surface 210_LS2 of the first body 210. A pair of the second concave portions CC2 may be respectively disposed in the second side surface 220_LS1 and the third side surface 220_LS2 of the second body 220. In some embodiments, one first concave portion CC1 and one second concave portion CC2 may be disposed at the first body 210 and the second body 220, respectively. In some embodiments, three or more first concave portions CC1 and three or more second concave portions CC2 may be disposed at the first body 210 and the second body 220, respectively.

The first concave portions CC1 and the second concave portions CC2 may be disposed closer to the folding area FA or the folding axis FX than the first side surfaces 210_SS1 and 220_SS1 of the first and second bodies 210 and 220. For example, a distance between the first side surface 210_SS1 of the first body 210 and the first concave portion CC1 may be equal to or greater than four times a distance between the folding area FA and the first concave portion CC1.

The first concave portions CC1 and the second concave portions CC2 may be recessed in a direction parallel to the folding axis FX. The first concave portions CC1 may be formed by recessing the second side surface 210_LS1 and the third side surface 210_LS2 of the first body 210 which extend in the second direction Y, and the second concave portions CC2 may be formed by recessing the second side surface 220_LS1 and the third side surface 220_LS2 of the second body 220 which extend in the second direction Y. Each of the first concave portion CC1 and the second concave portion CC2 may be recessed in a U-shape having a predetermined depth L1. Accordingly, the edges of the front surfaces 210_F and 220_F and the rear surfaces 210_R and 220_R of the first body 210 and the second body 220 may also have concave portions corresponding to the first concave portions CC1 and the second concave portions CC2.

The second protrusions P2 and the second concave portions CC2 are symmetrically arranged with the first protrusions P1 and the first concave portions CC1 with respect to the folding axis FX or the folding area FA. Therefore, the first protrusions P1 and the first concave portions CC1 will be mainly described below.

Referring to FIG. 8, the recess depth L1 of the first concave portion CC1 may be equal to or greater than a protruding length L2 of the first protrusion P1. For example, the first protrusions P1 and the second protrusions P2 may be respectively accommodated in the first concave portions CC1 and the second concave portions CC2 so as not to protrude outward beyond the second side surfaces or the third side surfaces. Accordingly, the first protrusions P1 and the second protrusions P2 may be disposed inward from the second side surfaces 210_LS1 and 220_LS1 or the third side surfaces 210_LS2 and 220_LS2 in a plan view. The width of the first protrusion P1 in the second direction Y may be, for example, in a range between about 0.2 mm and about 0.3 mm. For another example, a distance between the pair of first protrusions P1 may be in a range between about 3 mm and about 5 mm.

Referring to FIG. 9, the first protrusion P1 may include a flat portion P1_1, an inclined portion P1_2, and an end portion P1_3.

The flat portion P1_1 is a portion extending parallel to the front surface or the top surface of the first body 210. In an embodiment, the flat portion P1_1 may be positioned in the front direction of the metal plate 200 to extend parallel to the front surface of the first body 210.

The inclined portion P1_2 may be disposed opposite the flat portion P1_1. In an exemplary embodiment, the inclined portion P1_2 may be positioned in the rear side of the metal plate 200. The inclined portion P1_2 may be disposed to be inclined with respect to the flat portion P1_1. The inclined portion P1_2 may be inclined such that the thickness of the first protrusion P1 decreases toward the end portion P1_3. As will be described below, the inclined surface may be formed by bending and cutting a part (not shown) of the metal plate 200 connected to the protrusion in the manufacturing (or fabricating) process of the display device 1. The inclined portion P1_2 may include at least one inclined surface.

The end portion P1_3 may be the outermost part of the protrusion. The end portion P1_3 may be disposed between one end of the flat portion P1_1 and one end of the inclined portion P1_2. In an embodiment, the end portion P1_3 may be arranged to connect the one end of the flat portion P1_1 and the one end of the inclined portion P1_2.

The end portion P1_3 may include an uneven part. The uneven part may include a burr. As will be described below, the burr may be formed by bending and cutting the part of the metal plate 200 connected to the protrusion.

Referring back to FIG. 7, the metal plate 200 may further include function holes 250.

The function holes 250 may be disposed in the first body 210 and/or the second body 220. In one embodiment, the function holes 250 may be formed to penetrate the first body 210 in the third direction Z. In some embodiments, the function holes 250 may overlap sensing devices such as a camera, an infrared sensor, a motion sensor, or the like in the thickness direction.

The metal plate 200 may further include alignment portions 270.

The alignment portions 270 are disposed at the first body 210 and the second body 220. Each alignment portion 270 may be disposed between the folding area FA and the protrusion P. The alignment portions 270 may be disposed closer to the folding area FA or the folding axis FX than the first side surfaces 210_SS1 and 220_SS1 of the first body 210 and the second body 220. In an embodiment, one alignment portion 270 may be disposed between the first protrusion P1 and the folding area FA, and another alignment portion 270 may be disposed between the second protrusion P2 and the folding area FA. The alignment portions 270 may protrude from the second side surfaces 210_LS1 and 220_LS1 and the third side surfaces 210_LS2 and 220LS2 of the first body 210 and the second body 220 in a plan view. Each alignment portion 270 may include an alignment hole. The alignment portions 270 may provide reference points for alignment in case that the metal plate 200 is connected with another member.

Referring to FIGS. 7 to 9, the metal plate 200 is made of a metallic thin film having flexibility, so that deformation of the metal plate 200 can easily occur in the assembly process. Accordingly, the metal plate 200 may be integrally formed with a separate removable structure to maintain the shape and/or dimensions of the metal plate 200 until the display module 10, a jig, or the like is attached to the first body 210, the second body 220 and/or the connection portion 230 of the metal plate 200. For example, the metal plate 200 may have different shapes and/or structures before and after being fixed to the display module 10, a jig, or the like, and the above-described protrusions P, in particular, the burr and the inclined portions P1_2 of the protrusions P may be components formed by removing the removable structure.

Hereinafter, a metal plate before being attached to the display module 10 will be described in detail with reference to FIGS. 10 to 15.

Figure 10:
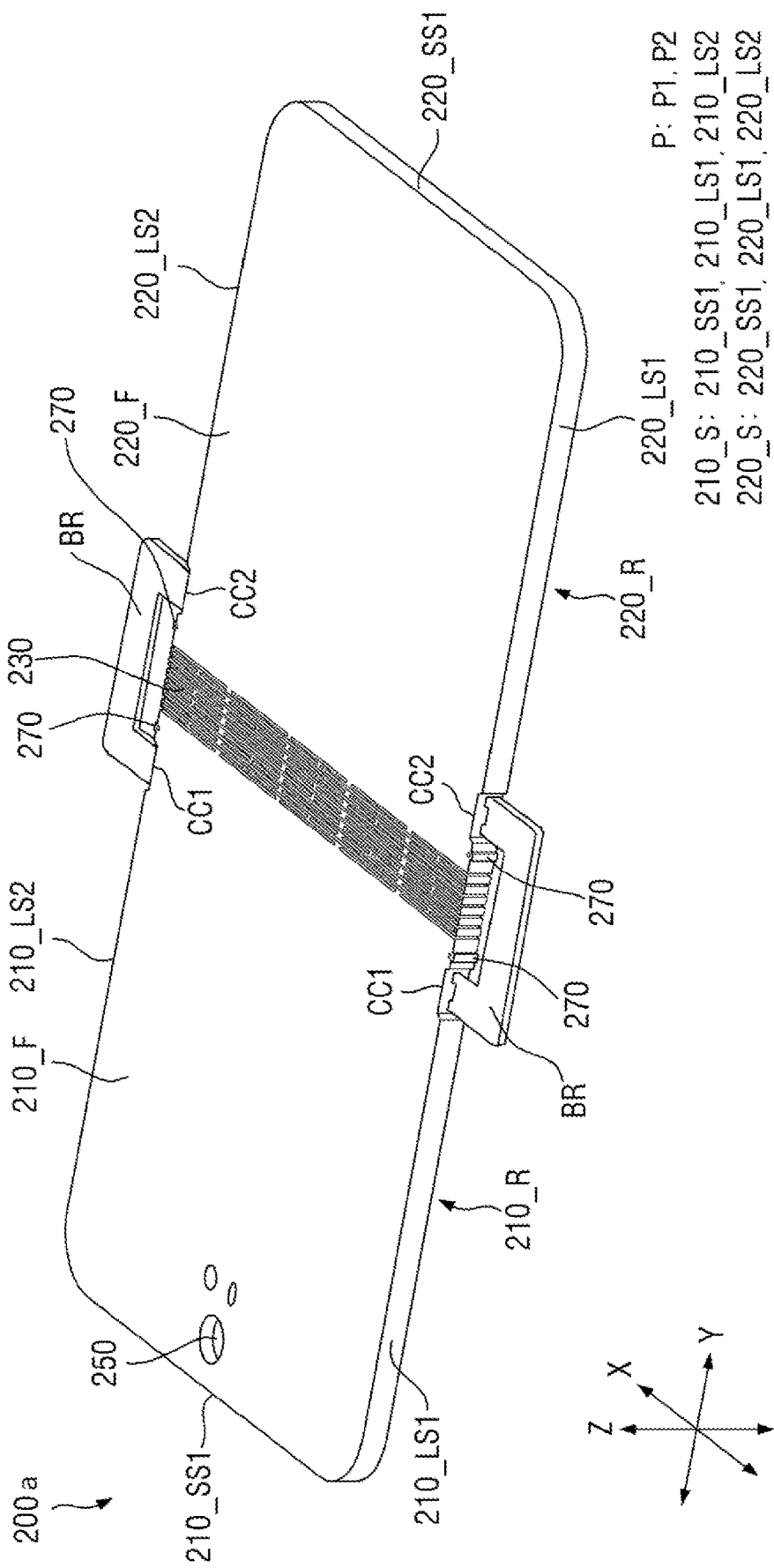
FIG. 10 is a schematic perspective view of a metal plate according to an exemplary embodiment.
Figure 11:
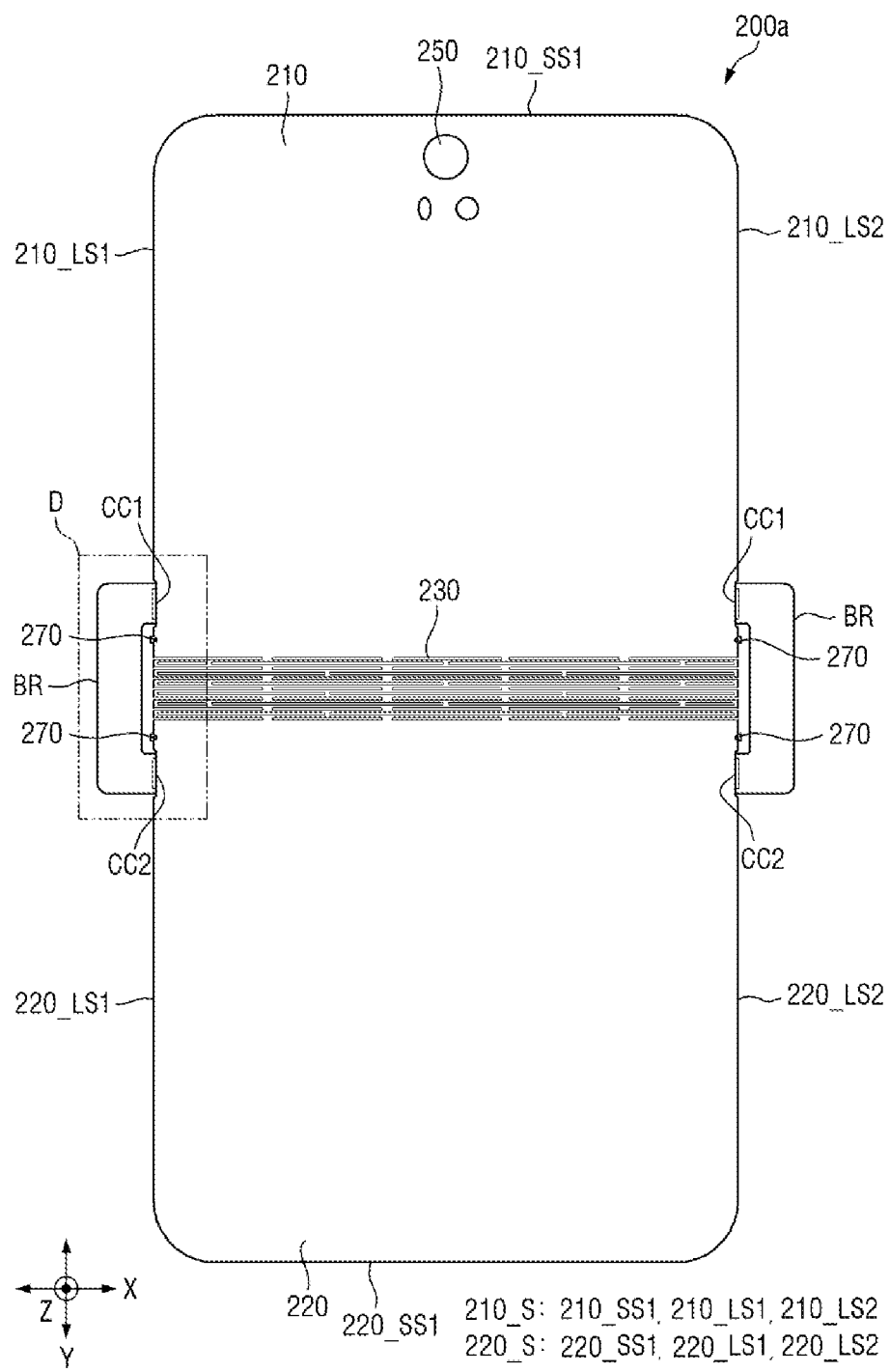
FIG. 11 is a schematic plan view of the metal plate of FIG. 10.
Figure 12:
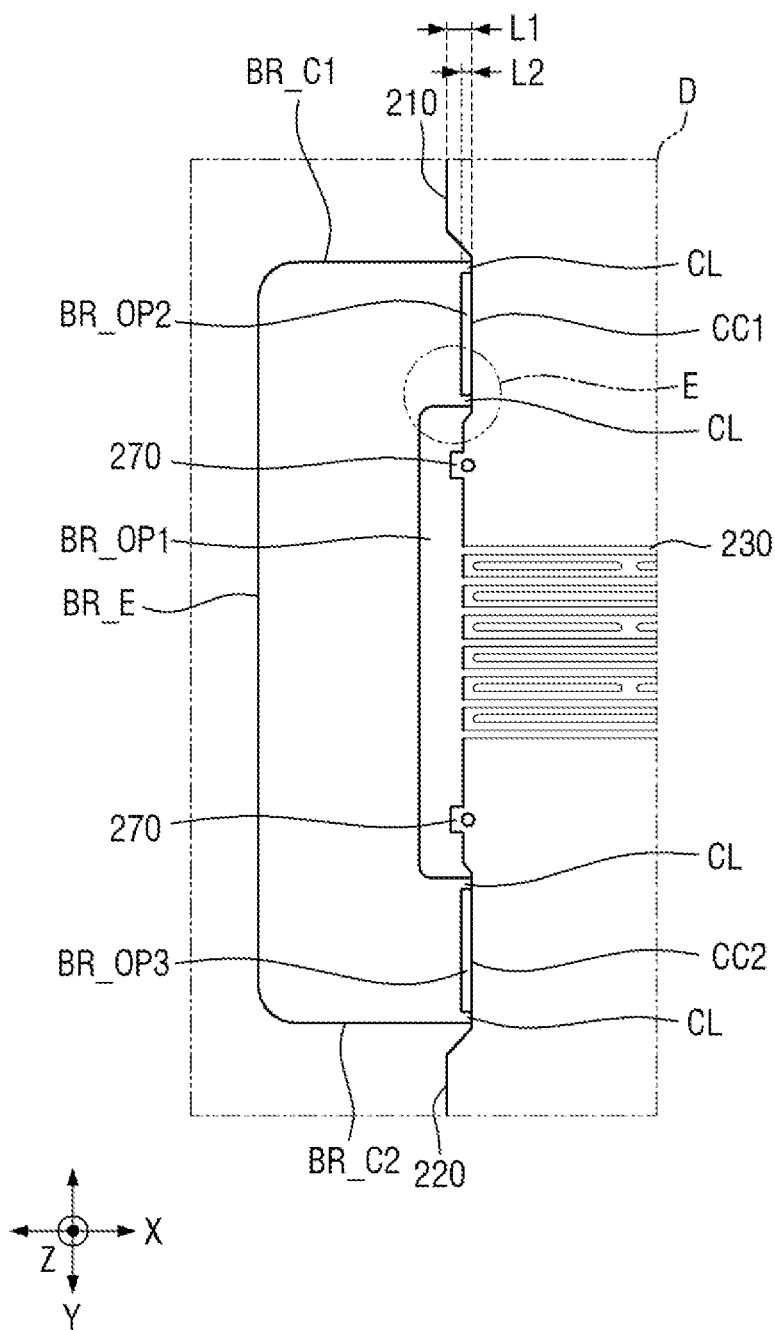
FIG. 12 is a schematic enlarged plan view of portion D of FIG. 11.
Figure 13:
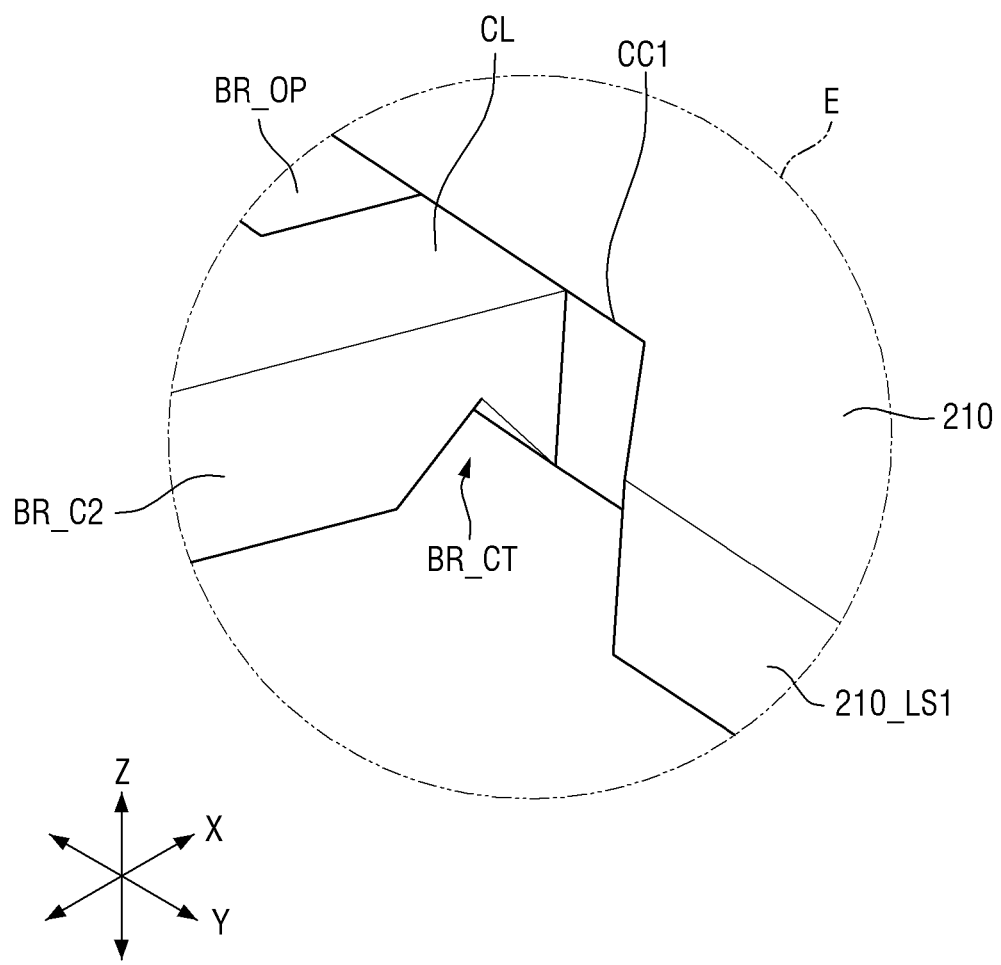
FIG. 13 is a schematic enlarged perspective view of portion E of FIG. 12.

FIG. 10 is a schematic perspective view of a metal plate according to an exemplary embodiment. FIG. 11 is a schematic plan view of the metal plate of FIG. 10. FIG. 12 is a schematic enlarged plan view of portion D of FIG. 11. FIG. 13 is a schematic enlarged perspective view of portion E of FIG. 12.

A metal plate 200a of FIGS. 10 to 13 is substantially identical or similar to the metal plate 200 of FIGS. 6 to 9 except that the metal plate 200a includes a pair of bridges BR instead of the protrusions P. Hereinafter, differences between the metal plate 200a of FIGS. 10 to 13 and the metal plate 200 of FIGS. 6 to 9 will be mainly described.

Referring to FIGS. 10 to 13, the metal plate 200a may include the first body 210 and the second body 220 arranged in the second direction Y, the connection portion 230 arranged between the first body 210 and the second body 220, and the pair of bridges BR. In an embodiment, the first body 210, the second body 220, the connection portion 230, and the pair of bridges BR may be integrally formed.

The first body 210 and the second body 220 may respectively include the front surfaces 210_F and 220_F, the rear surfaces 210_R and 220_R, and the side surfaces 210_S and 220_S between the front surfaces 210_F and 220_F and the rear surfaces 210_R and 220_R.

The side surfaces 210_S and 220_S of the first and second bodies 210 and 220 may respectively include the first side surfaces 210_SS1 and 220_SS1 extending in the first direction X, and the second side surfaces 210_LS1 and 220_LS1, and the third side surfaces 210_LS2 and 220_LS2 extending in the second direction Y, in a plan view. From the perspective of FIG. 10, the first, second, and third side surfaces 210_SS1, 210_LS1, and 210_LS2 of the first body 210 may be side surfaces positioned on the upper, left, and right sides, respectively. The first, second and third side surfaces 220_SS1, 220_LS1, and 220_LS2 of the second body 220 may be side surfaces positioned on the lower, left, and right sides, respectively.

The first body 210 and the second body 220 may respectively include the pair of first concave portions CC1, which are disposed in the second side surface 210_LS1 and the third side surface 210_LS2 of the first body 210, and the pair of second concave portions CC2, which are disposed in the second side surface 220_LS1 and the third side surface 220_LS2 of the second body 220. One end and the other end of the bridge BR, which will be described below, may be connected to the first concave portion CC1 and the second concave portion CC2, respectively.

The arrangement and shapes of the first body 210, the second body 220, and the connection portion 230 of the metal plate 200a may substantially be identical or similar to those of the metal plate 200 of the display device 1 of FIGS. 6 to 9, and thus a duplicate description will be omitted.

Each of the bridges BR may include one end connected to the first body 210 and another end connected to the second body 220. The pair of bridges BR may respectively be connected to at least portions of the side surfaces 210_S and 220_S of the metal plate 200a that extend in the second direction Y. One end of the bridge BR on the bottom side of FIG. 10 may be connected to the second side surface 210_LS1 of the first body 210, and another end thereof may be connected to the second side surface 220_LS1 of the second body 220. Similarly, one end of the bridge BR on the top side of FIG. 10 may be connected to the third side surface 210_LS2 of the first body 210, and another end thereof may be connected to the third side surface 220_LS2 of the second body 220. The pair of bridges BR may be arranged to surround at least a portion of the connection portion 230. The pair of bridges BR may protect the connection portion 230. In an embodiment, each of the bridges BR may have a U-shape in which a recessed portion is provided between the one end of the bridge BR connected to the first body 210 and the another end of the bridge BR connected to the second body 220 to be spaced apart from the connection portion 230. Accordingly, a first opening BR_OP1 elongated in the second direction Y may be formed between the bridge BR, and the first body 210, the second body 220, and/or the connection portion 230. The length of the first opening BR_OP1 in the second direction Y may be greater than the length of the connection portion 230 in the second direction Y. For example, the length of the connection portion 230 in the second direction Y may be in a range between about 10 mm and about 20 mm.

The pair of bridges BR, the first body 210, the second body 220, and the connection portion 230 may be disposed on the same plane (or same layer). For example, the pair of bridges BR may be disposed to overlap at least portions of the first body 210, the second body 220, and the connection portion 230 in the first direction X or the second direction Y. In FIG. 10, the pair of bridges BR may be disposed to protrude from the edges of the first body 210, the second body 220, and/or the connection portion 230 in a plan view. For example, the pair of bridges BR may be disposed to protrude by about 5 mm to about 6 mm from the edges of the first body 210, the second body 220, and/or the connection portion 230 in a plan view.

The pair of bridges BR may limit extension and contraction of the connection portion 230. The pair of bridges BR may maintain a distance between the first body 210 and the second body 220 in the second direction Y or a length of the connection portion 230 in the second direction Y, in a predetermined range. Accordingly, the pair of bridges BR may prevent deformation of the metal plate 200a and may maintain the overall size of the metal plate 200a constant so that the metal plate 200a can have accurate dimensions.

The pair of bridges BR may be formed to be removable, and the flat portion P1_1, the inclined portion P1_2, and the end portion P1_3 of the metal plate 200 of FIGS. 6 to 9 may be formed. For example, the metal plate 200 of FIGS. 6 to 9 may be the metal plate 200a of FIGS. 10 to 13 from which the pair of bridges BR has been removed.

Since the pair of bridges BR may be symmetrically arranged on both sides of the metal plate 200a, the bridge BR arranged on the left side of FIG. 11 will be mainly described below.

Each bridge BR may include an extension portion BR_E, a first fixing portion BR_C1, and a second fixing portion BR_C2.

The extension portion BR_E connects the first fixing portion BR_C1 to the second fixing portion BR_C2, which will be described later. The extension portion BR_E may have a rectangular shape elongated in the second direction Y, but the shape of the extension portion BR_E is not limited thereto. In one embodiment, the length of the extension portion BR_E in the second direction Y may be in a range between about 20 mm and about 30 mm. The extension portion BR_E may be disposed to be spaced apart from the connection portion 230 in the first direction X. For example, the extension portion BR_E may be spaced apart from the connection portion 230 by about 1 mm to about 2 mm in the first direction X.

The first fixing portion BR_C1 connects one side of the extension portion BR_E to the first body 210. The first fixing portion BR_C1 may be connected to the second side surface 210_LS1 of the first body 210. In an embodiment, the first fixing portion BR_C1 may be connected to the first concave portion CC1.

The second fixing portion BR_C2 connects another side of the extension portion BR_E to the second body 220. The second fixing portion BR_C2 may be connected to the second side surface 220_LS1 of the second body 220. In an embodiment, the second fixing portion BR_C2 may be connected to the second concave portion CC2.

A distance between the first fixing portion BR_C1 and the second fixing portion BR_C2 in the second direction Y may be greater than the length of the connection portion 230 in the second direction Y.

The first fixing portion BR_C1 and the second fixing portion BR_C2 may include connection legs CL. In an embodiment, the first fixing portion BR_C1 may include a pair of the connection legs CL, between which a second opening BR_OP2 elongated in the second direction Y is formed. The second fixing portion BR_C2 may include a pair of the connection legs CL, between which a third opening BR_OP3 elongated in the second direction Y is formed. The width of the second opening BR_OP2 and the third opening BR_OP3 in the second direction Y may be greater than the width of the connection leg CL in the second direction Y. For example, the width of the second opening BR_OP2 and the third opening BR_OP3 in the second direction Y may be at least ten (10) times greater than the width of the connection leg CL in the second direction Y. As another example, the width of the second opening BR_OP2 and the third opening BR_OP3 in the second direction Y may be in a range from about 2 mm to about 6 mm, and the width of the connection leg CL in the second direction Y may be in a range from about 0.1 mm to about 0.4 mm. The width of the second opening BR_OP2 and the third opening BR_OP3 in the first direction X may be similar to the width of the connection leg CL in the second direction Y. For example, the width of the second opening BR_OP2 and the third opening BR_OP3 in the first direction X may be in a range from about 0.1 mm to about 0.4 mm.

Each of the first fixing portion BR_C1 and the second fixing portion BR_C2 may include a cut groove BR_CT.

The cut grooves BR_CT may be formed in the second direction Y in the rear surfaces of the first fixing portion BR_C1 and the second fixing portion BR_C2. As shown in FIG. 13, the cut groove BR_CT may have a shape recessed forward from the rear surface of the connection leg CL. The cut groove BR_CT may be formed in the middle portion of the connection leg CL to be connected to the second opening BR_OP2 or the third opening BR_OP3 formed by the pair of connection legs CL. In an embodiment, the cut groove BR_CT may include two inclined surfaces arranged such that a gap between the inclined surfaces becomes narrower as approaching the front surface of the connection leg CL. In some embodiments, the inclined surface may include a curved surface.

The pair of bridges BR may be bent at the cut grooves BR_CT to be easily detached from the first body 210 and the second body 220. The pair of bridges BR may be almost removed at the cut grooves BR_CT, and the remaining portions of the connection legs CL of the bridges BR may become the protrusions P of the metal plate 200 shown in FIGS. 6 to 9. At least a portion of the inclined surface forming the cut groove BR_CT may be the inclined portion P1_2 of the protrusion P of FIGS. 6 to 9.

Since alignment holes of alignment portions 270 of the metal plate 200a shown in FIGS. 10 to 13 are substantially identical or similar to the alignment holes of the alignment portions 270 of the metal plate 200 shown in FIGS. 6 to 9, a duplicate description will be omitted below.

Figure 14:
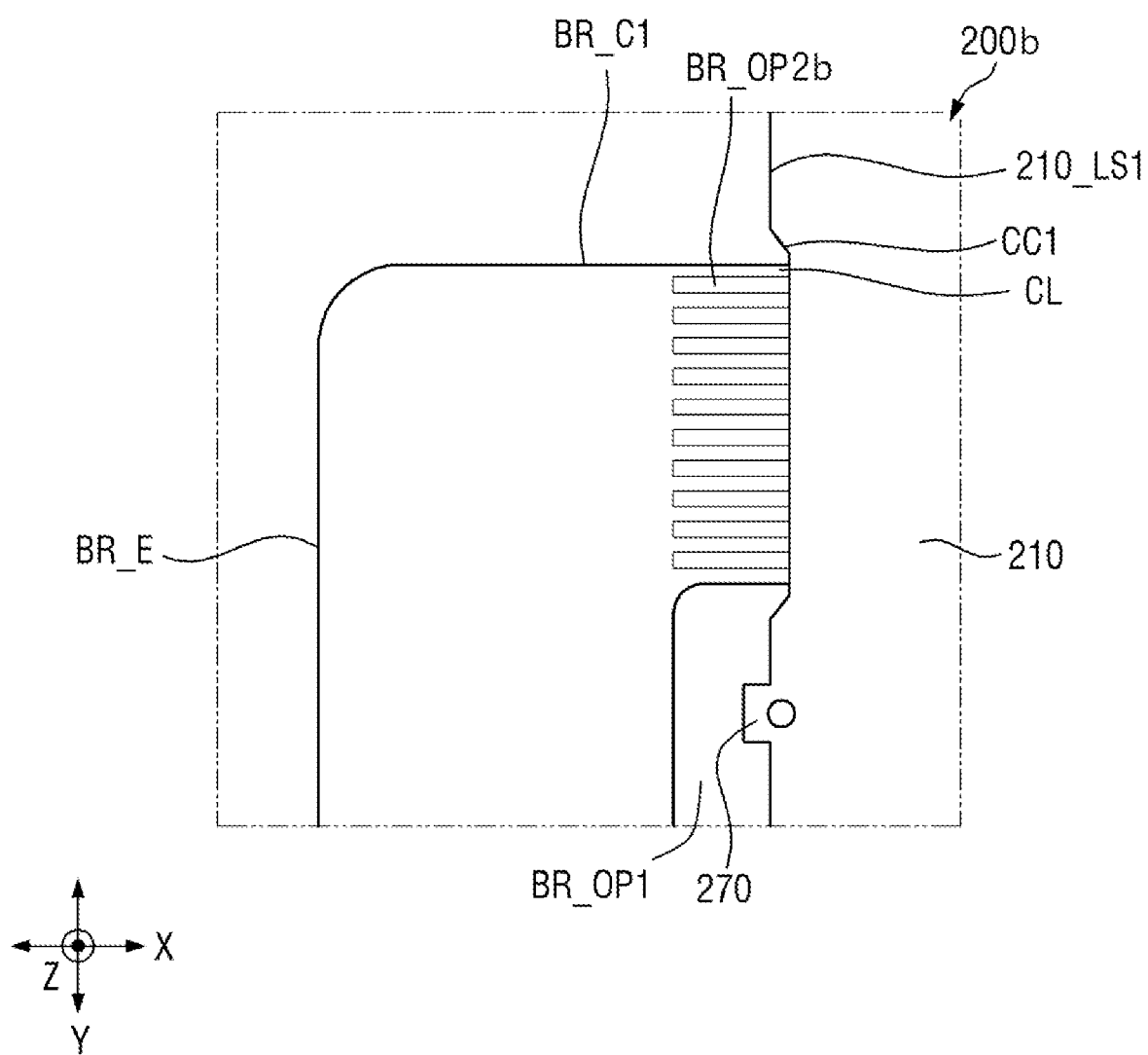
FIG. 14 is a schematic enlarged plan view of a first fixing portion of a metal plate according to another embodiment.

FIG. 14 is a schematic enlarged plan view of a first fixing portion of a metal plate according to another embodiment.

A metal plate 200b of FIG. 14 is different from the metal plate 200a of FIG. 10 at least in that the metal plate 200b includes multiple connection legs CL.

Since a second fixing portion BR_C2 is symmetrical with a first fixing portion BR_C1 with respect to the connection portion 230, the first fixing portion BR_C1 will mainly be described below.

Referring to FIG. 14, the first fixing portion BR_C1 may include three or more connection legs CL and second openings BR_OP2b. In one embodiment, the first fixing portion BR_C1 may include eleven connection legs CL and ten second openings BR_OP2b therebetween. In this case, the second openings BR_OP2b may be formed such that the width of the second openings BR_OP2b in first direction X is greater than that of the second openings BR_OP2b in the second direction Y.

In the metal plate 200b according to the embodiment of FIG. 14, in case that the flexibility of the metal plate 200b is relatively high, it is possible to minimize deformation of the metal plate 200b by using a relatively large number of the connection legs CL until another member is attached to the metal plate 200b or the metal plate 200b is mounted on a jig for fixing.

Since the metal plate 200b of FIG. 14 is substantially identical or similar to the metal plate 200a of FIG. 10 except that the metal plate 200b includes multiple connection legs CL, a duplicate description will be omitted.

Figure 15:
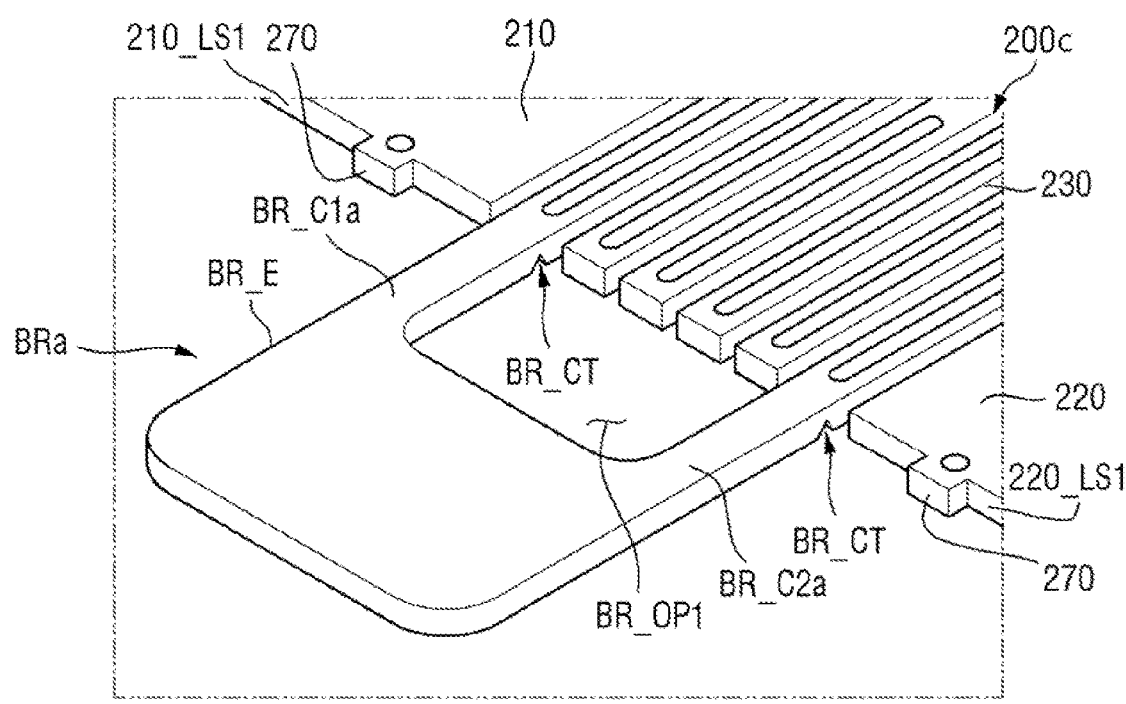
FIG. 15 is a schematic enlarged perspective view of a bridge of a metal plate according to still another embodiment.

FIG. 15 is a schematic enlarged perspective view of a bridge of a metal plate according to still another embodiment.

A metal plate 200c of FIG. 15 is different from the metal plate 200a of FIG. 10 at least in that the bridge BR is disposed at the connection portion 230.

Referring to FIG. 15, the bridge BR may be disposed at the connection portion 230. The bridge BR may be integrally connected to a part of the connection portion 230. One end and the other end of the bridge BR may be integrally connected to the pattern of the connection portion 230 forming openings. The first fixing portion BR_C1 of the bridge BR may be integrally connected to a pattern region adjacent to the first body 210, and the second fixing portion BR_C2 of the bridge BR may be integrally connected to the other pattern region adjacent to the second body 220. A first opening BR_OP1 may be formed between the extension portion BR_E of the bridge BR and the connection portion 230. The first fixing portion BR_C1 and the second fixing portion BR_C2 of the bridge BR may be disposed between the alignment portions 270.

The one pattern region and the other pattern region of the connection portion 230 may be outermost regions of the connection portion 230. The one pattern region and the other pattern region may be corner regions of the connection portion 230.

The cut grooves BR_CT may be formed in the second direction Y at the boundary between the first fixing portion BR_C1a and the connection portion 230 and at the boundary between the second fixing portion BR_C2a and the connection portion 230.

In the metal plate 200c, the bridge BRa may be integrally connected to the pattern of the connection portion 230 to limit extension and contraction of the connection portion 230 in the second direction Y, so that the metal plate 200c can maintain accurate dimensions until another member is attached to the metal plate 200c or until the metal plate 200c is mounted on a jig for fixing.

Since the metal plate 200c of FIG. 15 is substantially identical or similar to the metal plate 200a of FIG. 10 except that the bridge BR is disposed at the connection portion 230, a duplicate description will be omitted.

In concluding the detailed description, those skilled in the art will appreciate that many variations and modifications can be made to the embodiments without substantially departing from the principles of the disclosure. Therefore, the disclosed embodiments of the disclosure are described in a generic and descriptive sense only and not for purposes of limitation.

What is claimed is:

1. A display device comprising:
   a display panel including:
      a front surface that displays an image; and
      a rear surface, wherein the display panel is foldable with respect to a folding axis extending in a first direction; and
   a metal plate disposed on the rear surface of the display panel, wherein
   the metal plate includes:
      a first body and a second body that are arranged in a second direction intersecting the first direction;
      a patterned portion disposed between the first body and the second body to overlap the folding axis in a thickness direction of the display device;
      at least one protrusion protruding parallel to the folding axis from an edge of at least one of the first body, the second body, and the patterned portion; and the at least one protrusion includes a burr.

2. The display device of claim 1, wherein the at least one protrusion comprises a plurality of protrusions disposed in the first body and the second body.

3. The display device of claim 2, wherein
each of the first body and the second body includes first and second side surfaces extending in the second direction, and
the plurality of protrusions include:
a pair of first protrusions disposed on the first side surface and the second side surface of the first body; and
a pair of second protrusions disposed on the first side surface and the second side surface of the second body.

4. The display device of claim 2, wherein the plurality of protrusions are symmetrically arranged with respect to the folding axis.

5. The display device of claim 1, wherein the burr is disposed at an end portion of the at least one protrusion.

6. The display device of claim 5, wherein a thickness of the at least one protrusion decreases toward the end portion of the at least one protrusion.

7. The display device of claim 5, wherein
the at least one protrusion includes an inclined surface with respect to the front surface or the rear surface, and
the burr is disposed at an end of the inclined surface.

8. A display device comprising:
a display panel including:
a front surface that displays an image; and
a rear surface, wherein the display panel is foldable with respect to a folding axis extending in a first direction; and
a metal plate disposed on the rear surface of the display panel, wherein
the metal plate includes;
a first body and a second body that are arranged in a second direction intersecting the first direction,
a patterned portion disposed between the first body and the second body to overlap the folding axis in a thickness direction of the display device; and
at least one protrusion protruding parallel to the folding axis from an edge of at least one of the first body, the second body, and the patterned portion,
the at least one protrusion comprises a plurality of protrusions disposed in the first body and the second body,
each of the first body and the second body includes first and second side surfaces extending in the second direction,
the plurality of protrusions include;
a pair of first protrusions disposed on the first side surface and the second side surface of the first body; and
a pair of second protrusions disposed on the first side surface and the second side surface of the second body,
each of the first body and the second body includes a first concave portion on the first side surface and a second concave portion on the second side surface, the first and second concave portions being recessed in a direction parallel to the folding axis,
the pair of first protrusions are disposed in the first concave portion and the second concave portion of the first body, and
the pair of second protrusions are disposed in the first concave portion and the second concave portion of the second body.

9. The display device of claim 8, wherein each of a recess depth of the first concave portion and a recess depth of the second concave portion is greater than each of a protruding length of the first protrusion and a protruding length of the second protrusion.

10. A display device comprising:
a display panel including:
a front surface that displays an image; and
a rear surface, wherein the display panel is foldable with respect to a folding axis extending in a first direction; and
a metal plate disposed on the rear surface of the display panel, wherein
the metal plate includes;
first body and a second body that are arranged in a second direction intersecting the first direction;
a patterned portion disposed between the first body and the second body to overlap the folding axis in a thickness direction of the display device; and
at least one protrusion protruding parallel to the folding axis from an edge of at least one of the first body, the second body, and the patterned portion,
the at least one protrusion comprises a plurality of protrusions disposed in the first body and the second body,
the plurality of protrusions are symmetrically arranged with respect to the folding axis,
the plurality of protrusions are disposed in the patterned portion,
the patterned portion includes a pattern forming a plurality of openings, and
the plurality of protrusions and the pattern are integral with each other.

11. A metal plate comprising:
a first body and a second body that are arranged in a first direction;
a patterned portion disposed between the first body and the second body; and
a pair of bridges that limit extension and contraction of the patterned portion within a range, each of the pair of bridges including:
a first end connected to the first body; and
a second end connected to the second body.

12. The metal plate of claim 11, wherein the pair of bridges are spaced apart from the patterned portion and surround side surfaces, respectively, of the patterned portion.

13. The metal plate of claim 11, wherein each of the pair of bridges includes:
an extension portion extending in the first direction;
a first fixing portion connecting a first end of the extension portion to the first body; and
a second fixing portion connecting a second end of the extension portion to the second body.

14. The metal plate of claim 13, wherein each of the first fixing portion and the second fixing portion includes:
a plurality of connection legs; and
at least one opening between the plurality of connection legs.

15. The metal plate of claim 13, wherein each of the first fixing portion and the second fixing portion includes a cut groove.

16. The metal plate of claim 13, further comprising:
at least one alignment portion disposed between the first fixing portion and the second fixing portion.

17. The metal plate of claim 13, wherein
each of the first body and the second body includes a first concave portion and a second concave portion that are recessed in a second direction intersecting the first direction, and
the first fixing portion and the second fixing portion are respectively disposed in the first concave portion and the second concave portion.

18. A metal plate comprising:
a first body and a second body that are arranged in a first direction;
a patterned portion disposed between the first body and the second body; and
a pair of bridges that limit extension and contraction of the patterned portion within a range, each of the pair of bridges including:
a first end connected to a first side of the patterned portion; and
a second end connected to a second side of the patterned portion.

19. The metal plate of claim 18, wherein
the patterned portion includes a pattern forming a plurality of openings, and
the pair of bridges and the pattern are integral with each other.

20. The metal plate of claim 19, wherein each of the pair of bridges includes:
an extension portion extending in the first direction;
a first fixing portion connecting a first side of the extension portion to a first corner region of the patterned portion; and
a second fixing portion connecting a second side of the extension portion to a second corner region of the patterned portion.

* * * * *